United States Patent [19]

Kessler

[11] Patent Number: 4,686,507

[45] Date of Patent: Aug. 11, 1987

[54] INTEGRATED SEMICONDUCTOR CIRCUIT

[75] Inventor: Heinrich Kessler, Munich, Fed. Rep. of Germany

[73] Assignee: Siemens Aktiengesellschaft, Berlin and Munich, Fed. Rep. of Germany

[21] Appl. No.: 815,189

[22] Filed: Dec. 26, 1985

Related U.S. Application Data

[63] Continuation of Ser. No. 634,469, Jul. 24, 1984, abandoned.

[30] Foreign Application Priority Data

Aug. 2, 1983 [DE] Fed. Rep. of Germany ....... 3327879

[51] Int. Cl.$^4$ .............................................. H03M 1/18
[52] U.S. Cl. ............................................ 340/347 AD
[58] Field of Search ................. 340/347 AD; 324/115

[56] References Cited

U.S. PATENT DOCUMENTS

| | | | |
|---|---|---|---|
| 3,626,408 | 12/1971 | Carbrey | 340/347 AD |
| 4,200,863 | 4/1980 | Hodges | 340/347 AD |
| 4,295,089 | 10/1981 | Cooperman | 340/347 AD |
| 4,451,821 | 5/1984 | Domogalla | 340/347 AD |

OTHER PUBLICATIONS

Biensman "1980 IEEE International Solid-State Circuits Conference Digest of Technical Papers" Feb. 1980, pp. 16–17.
"PALs: Programmable Logic Functions Help Minimize Hardware" from PAL Programmable Array Logic Handbook, Third Edition, pp. 8-8 through 8-13, John Birkner/Wescon, 1979.
8172 IEEE Int.-Solid State Circuits Conf. (1980) Feb., New York, Session I: A/D and D/A Conveters, pp. 16 and 17.

Primary Examiner—Charles D. Miller
Attorney, Agent, or Firm—Hill, Van Santen, Steadman & Simpson

[57] ABSTRACT

An integrated semiconductor circuit which contains both a microprocessor as well as an analog-to-digital converter. Two D/A converters are allocated to an A/D converter. One of the D/A converters generates a internal base potential from an externally supplied fixed base potential and an externally supplied fixed reference potential under the direction of the microprocessor. The other one generates a internal reference potential from the two external potentials. The two internal potentials form the reference voltage which serves for the A/D conversion according to the principle of successive approximation. By so doing, the same circuit can be controlled by measuring points having different voltage ranges without the converter having to be provided with additional comparison stages. These are involved in comparison to the A/D conversion to be applied and serve the purpose of increasing the resolution.

10 Claims, 6 Drawing Figures

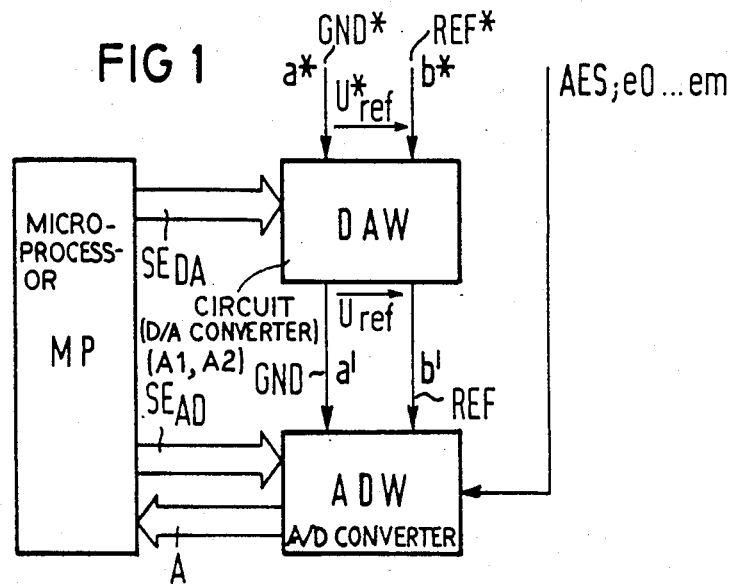
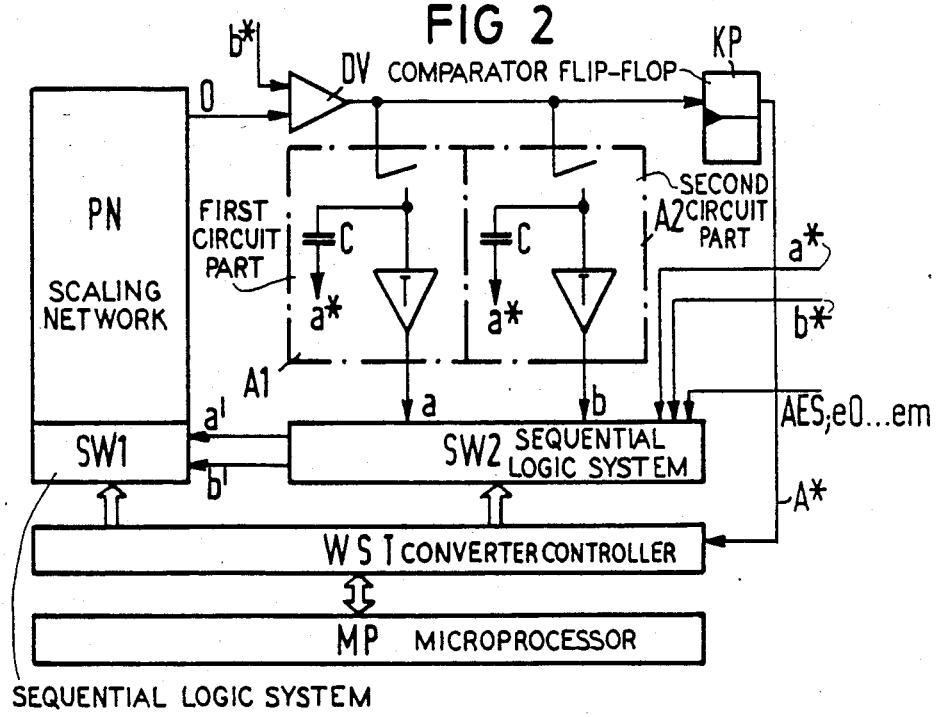

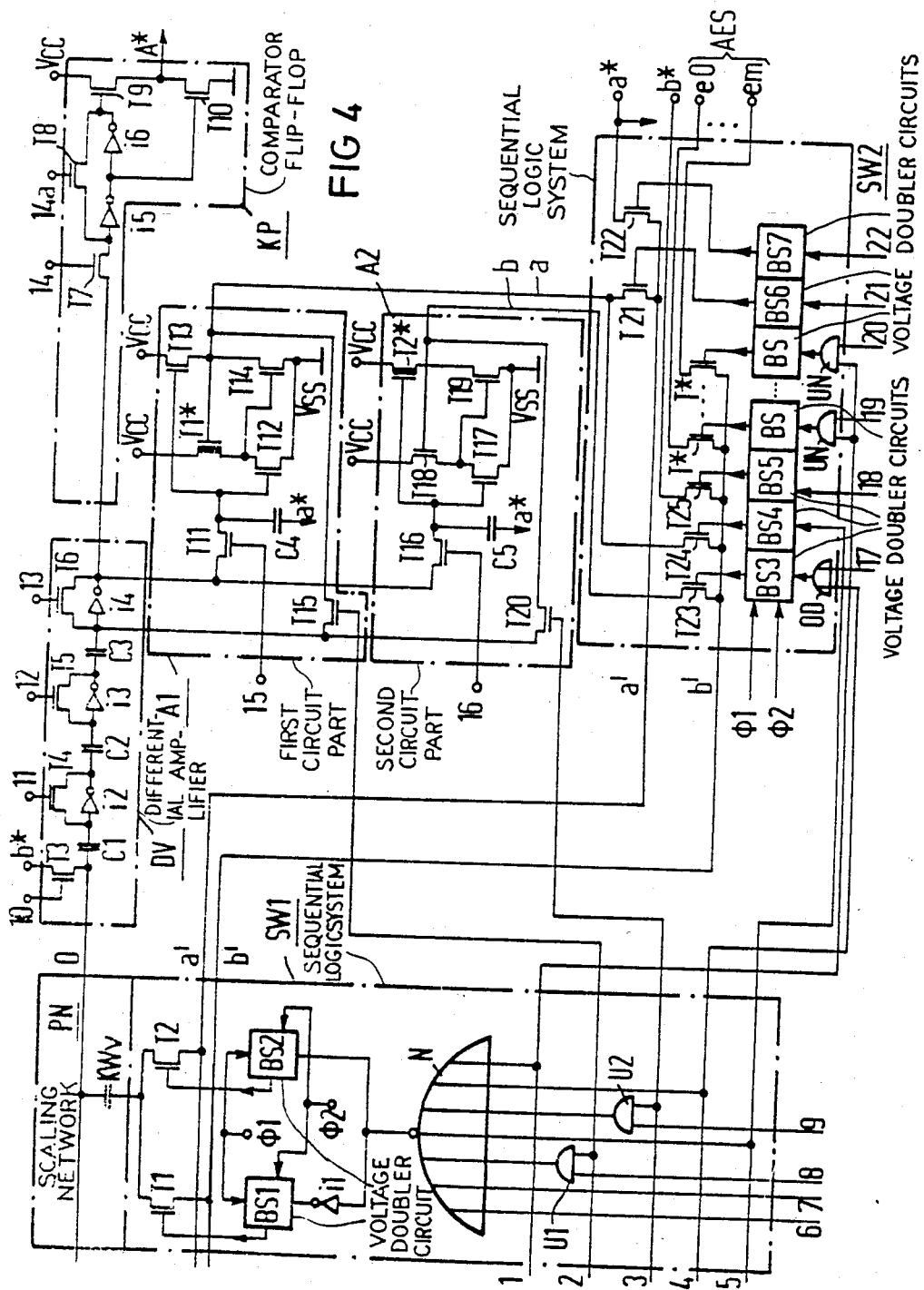

INTEGRATED SEMICONDUCTOR CIRCUIT

This is a continuation of application Ser. No. 634,469 filed July 24, 1984, now abandoned.

BACKGROUND OF THE INVENTION

The present invention is concerned with an integrated semiconductor circuit which comprises a microprocessor and an analog-to-digital converter which is in turn controlled by an analog input signal to be interpreted by the microprocessor and by at least one analog reference voltage.

The reference "Siemens Forschungs- und Entwicklungsberichte", Vol. 8 (1979) No. 5, pages 261-263, incorporated herein by reference, can be cited as prior art. It is pointed out therein that the increased use of digital control electronics in the form of microprocessors and microcomputers requires analog-to-digital converters and digital-to-analog converters in a correspondingly increased scope as interfaces between the analog environment and the computer. Converter modules that are manufactured in the same technology as the microprocessors and can thus be co-integrated on the computer chip are of particular interest. In the interests of high converter speed, it is recommended to employ converters which function according to the principle of step-by-step approximation (=successive approximation). It is also advantageous when the precision or scaling network required given analog-to-digital converters functioning according to the principle of successive approximation is realized by means of a capacitance network consisting of MOS capacitors (instead of the resistance network, for example an R/2R network, that is otherwise standard). Details with respect to this are cited in the above mentioned reference.

A monolithic combination of a single-chip computer and an analog-to-digital converter is thus applied for the control of events that produce analog process quantities. The integrated A/D converter is usually responsible for a plurality of analog measuring points which, depending on the respective information generators employed at the measuring points, have different, non-coinciding, analog voltage ranges. This, however, means that the full resolution of the converter (often 8 bit) cannot be fully exploited for a measuring point.

In order to resolve the problem just pointed out above, the analog-to-digital converter that is co-integrated on the computer chip could be provided with a correspondingly higher resolution, for example with a resolution of 10 bits, than is required per se for the individual measuring points. The analog process quantity converted with, for example, a width of 10 bits is then brought to the desired size having a smaller bit width by means of scaling algorithms by use of the computer program.

SUMMARY OF THE INVENTION

As has been perceived in accordance with the invention, there is another and more advantageous possibility for resolving this problem.

It is proposed according to the invention that given the initially defined, integrated semiconductor circuit, a circuit part having the function of a digital-to-analog converter is provided. This circuit part is controllable by the microprocessor and serves the purpose of controlling the analog-to-digital converter with a reference voltage. Particularly provided in this circuit is the function of a digital-to-analog converter for the programmed setting of the lower reference potential (=base or low end potential) and a further digital-to-analog function for the programmed setting of the upper reference potential which jointly forms the respective reference voltage to be applied to the analog-to-digital converter. Both functions are controlled by the microprocessor. The control program of the computer can define the lower and upper reference potential required for the selected measuring point in this fashion before the beginning of the conversion. The analog-to-digital converter then measures the difference between these two potentials —referred to below as "GND"(=base or ground potential) and as "REF"(=upper reference potential) so that the conversion result immediately represents the desired, scaled value.

The following advantages are obtained:

(1) Additional expense for scaling the result is not required.

(2) An analog-to-digital converter having a resolution that need not be greater than required by the precision demanded of the measured variables suffices. As experience has taught, the expense for the reference network of an A/D converter rises exponentially with the resolution to be achieved by means of the converter.

(3) Given an analog-to-digital converter that functions according to the principle of capacitive charge distribution, an expansion on the basis of the D/A converter or D/A converters can be achieved without great additional expense given the circuit according to the invention.

Both the capacitive reference network of the A/D converter as well as its differential amplifier can be employed for the D/A conversion provided according to the invention. In a preferred development of the invention, a respective register for storing the corresponding digital value of the potential, a respective (internal) capacitor for the dynamic storage of the analog value as well as a low-resistance final amplifier (designed as a source follower, for example) are also provided for each of the potentials GND and REF forming the reference voltage $U_{ref}$ provided for the D/A conversion.

BRIEF DESCRIPTION OF THE DRAWINGS

FIG. 1 shows a general block diagram of an integrated semiconductor circuit corresponding to the invention;

FIG. 2 illustrates a block diagram of the embodiment specified in FIG. 1;

FIGS. 3, 4, 4a, and 4b together show a detailed circuit diagram for an advantageous embodiment of the invention according to FIG. 2.

DESCRIPTION OF THE PREFERRED EMBODIMENTS

Figure 3:
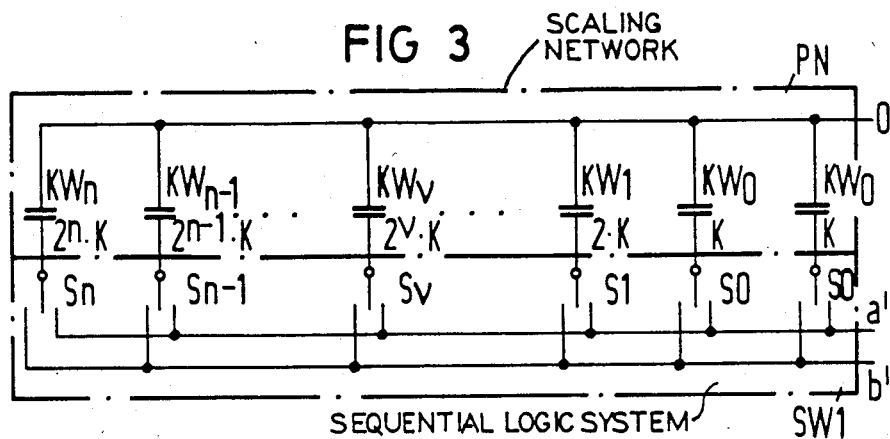

The block diagram shown in FIG. 1 corresponds to the above definition of the invention. It contains a microprocessor MP expanded, in particular, into a microcomputer and an analog-to-digital converter ADW which is monolithically combined therewith and controlled via control input $SE_{AD}$. The signal input of the latter is controlled by the analog input signals AES to be processed, these being then forwarded to the data input of the microprocessor MP in the form of digital data.

According to the invention, then a circuit DAW has been co-integrated which is controlled by the microprocessor MP by output A, and which generates the potentials GND and REF according to the requirements of the microprocessor MP, said potentials GND and REF forming the reference voltage $U_{ref}$ of the A/D converter.

For this purpose, the circuit DAW which is externally controlled with a fixed reference potential $U^*_{ref}$ made available by a voltage source has two externally charged inputs. The input a* receives the external base potential GND* and the input b* receives the external reference potential REF* which forms the external reference voltage $U^*_{ref}$ together with the external base potential GND*. These two inputs of the circuit part DAW correspond to the two internal outputs a' and b' thereof which lead to the analog-to-digital converter ADW, whereby a' supplies the internal base potential GND and b' supplies the internal reference potential REF. The circuit part DAW is then designed such that due to the control exerted on it by the microprocessor MP, it sets both the internal base potential GND as well as the internal reference potential REF such that both potentials jointly supply the reference voltage $U_{ref}$ required by the analog-to-digital converter ADW for the respective case. Both GND as well as REF are thus programmable in an independent fashion via the microprocessor MP.

The analog external signals AES are supplied by the system (not shown) which is controlled by the microprocessor on the basis of these signals. The circuit ADW is designed such that, due to the control exercised over it by the microprocessor MP, it selects the individual analog signals now required by the microprocessor MP, converts it into the corresponding digital value with respect to the reference potentials supplied by the circuit DAW, and offers it in a result register for read-out by the microprocessor MP.

As already indicated above, it is advantageous when the circuit part DAW contains two digital-to-analog converters, wherein the one is responsible for setting the internal base potential GND and the other is responsible for setting the internal reference potential REF, both under the supervision of the microprocessor MP. A corresponding design of the circuit DAW is shown in FIG. 2. FIG. 2 also contains the more detailed design of the circuit ADW. The latter consists of the precision or scaling network PN, the differential amplifier DV, the comparator flip-flop KP, the sequential logic system SW1, and a part of the converter controller WST.

The circuit DAW consists of first and second further circuit parts A1 and A2 which essentially correspond to one another and also consists of the remaining parts of the sequential logic system SW2 and of the converter controller WST. Together with units SW2, SW1, PN, and DV, A1 and A2 are controlled by the converter controller such that they each respectively exercise the function of a digital-to-analog converter with the job of supplying one of the two potentials (i.e. the base potential GND and the reference potential REF) which define the internal reference voltage $U_{ref}$, and make it available for the analog-to-digital conversion. In the illustrated exemplary case, the first circuit part A1 is responsible for the base potential GND and the second circuit part A2 is responsible for the reference potential REF. Both circuit parts respectively contain an analog memory indicated by means of a capacitor C and a respective driver T whose output a or b supplies the analog potential stored at the capacitor C to the inputs a or b of the sequential logic system SW2.

In addition to the two inputs a and b just mentioned, the sequential logic system SW2 also has the inputs a* and b* as well as the inputs AES. The external reference voltage $U^*_{ref}$ is supplied to a* and b* and the analog potentials to be measured are supplied to AES. Controlled by the converter controller WST, the job of SW2 is to forward the required input potentials to the sequential logic system SW1 via the two outputs a' and b'. Again controlled by the converter controller WST, the parts of the precision or scaling network PN corresponding to the individual digital bits are controlled with the input potentials a' or b' in the sequential logic system SW1. An analog signal defined by the converter controller appears as a result thereof at the output 0 of the precision or scaling network PN, the difference of said analog signal with respect to the reference potential REF* defined by the line b* being amplified in the differential amplifier DV.

When one of the two internal reference potentials GND or REF is to be set, then the converter controller connects a closed feedback loop from the output of the differential amplifier DV via A1 or A2, SW2, SW1 and PN, whereby the output potential a or b of the circuit parts A1 or A2 is varied until the input voltage at the differential amplifier, i.e. the difference of the potentials at b* and 0, has been compensated.

In addition to being connected to the previously mentioned inputs of the circuit parts A1 and A2, the output of the differential amplifier DV is also connected to the input of the comparator flip-flop KP. This comparator flip-flop KP converts the analog input voltage of the differential amplifier into a digital bit. The output of KP lies at the logic level "1" as long as the relationship b*−0>"zero" is valid for the potentials at b* and 0, and lies at the logic level "0" as long as b*−0<"zero". The output of the comparator flip-flop KP is connected to an input of the converter controller WST, so that the latter can identify the significance of the bit just handled given analog-to-digital conversion according to the method of successive approximation.

The converter controller WST has two jobs. On the one hand, it serves as the sole interface between the microprocessor MP and the converter and, as an executive sequencer on the other hand, it must offer all of the control signals required for the execution of the individual phases of the digital-to-analog conversion and of the analog-to-digital conversion. As a microprocessor interface, WST contains registers for (a) the value of the internal base potential (GDDT-ground data), (b) The value of the internal reference potential (RFDT reference data), (c) The value of the result of the A/D conversion (RSDT-result data), and (d) the selection of the input voltage to be converted (CAN-convert analog input).

As an executive sequencer, WST derives the required control signals from the clock system of the microprocessor MP. Both jobs can be realized in conventional digital technology. This is the reason that the realization of the converter controller WST is not discussed in greater detail below.

The microprocessor initiates the functional sequence of the controller with a start signal. In response thereto, the converter controller WST successively generates all control signals at the necessary point in time and with the necessary duration, as required for the execution of the conversion according to the invention. The controller can be constructed by means of a PLA (programmable logical array). Instructions for such an array have been disclosed, for example, in the publication of the Monolithic Memories Company, PAL Handbook, 3rd Edition, pages 8-8 through 8-13, incorporated herein by reference.

As may be seen from FIGS. 3 and 4, and the circuit according to the invention shown there, the precision or scaling network PN is preferably designed as a capacitor network. This means that every stage of the precision or scaling network PN contains a respective, weighted capacitor KW$\nu$ whose one terminal lies at the output O of the capacitor network PN and whose other output can be alternatively applied by means of a change-over switch S$\nu$ to two inputs a′, b′ of the sequential logic system SW1. The weighting occurs in a standard manner such that capacitor KW$_n$ of the capacitor network PN assigned to the comparison stage responsible for the highest bit significance n receives the capacitance $K \cdot 2^n$, where K denotes the basic value of the capacitor weighting. The $\nu^{th}$ comparison stage assigned to the $\nu^{th}$ bit significance ($\nu = n, n-1, n-2, \ldots 2, 1, 0$) has a capacitor having the capacitance $K \cdot 2\nu$. It thus follows for the comparison stage assigned to the lowest bit significance (this comparison stage being redundantly provided for known reasons) that the capacitor KW$_o$ allocated to it from the precision network PN has the capacitance KW$_o$=K.

Figure 4A:
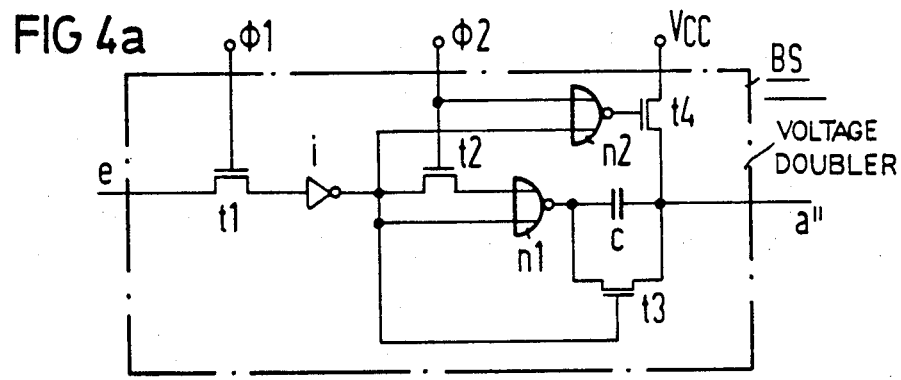
Figure 4B:
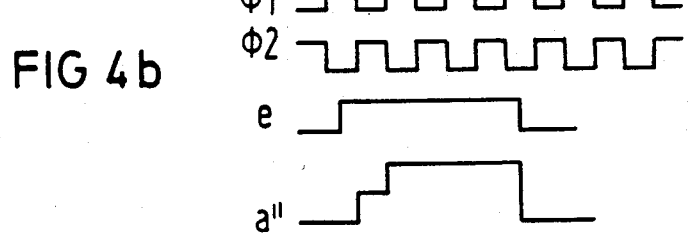

FIG. 4 represents the design of the individual comparison stages in the analog-to-digital converter as well as the design of the remaining circuit parts shown in FIG. 2, with the exception of the converter controller WST and the microprocessor MP which are parts designed in a traditional manner. One circuit part whose preferred embodiment is shown in FIG. 4a is only shown as a block in FIG. 4 for space reasons. FIG. 4b presents the time diagram to be applied for the clock control of this part.

As already repeatedly noted, each of the capacitors KW$\nu$ provided in the capacitor network PN has its one terminal applied to the output 0 of the network PN, whereas its other terminal is connected to a change-over switch S$\nu$. FIG. 4 shows an advantageous embodiment of this change-over switch S$\nu$ executed in MOS technology, whereby FIG. 4a is referenced with respect to the circuit parts BS1 and BS2.

The output of the change-over switch S$\nu$ which is respectively in communication with the capacitor KW$\nu$ of the individual comparison stage of the precision network PN is given by the drain of a first MOS field effect transistor T1 and the drain of a second MOS field effect transistor T2 which is directly connected to the capacitor KW$\nu$. Both transistors T1 and T2 are normally off and are identical to one another. Just like the other transistors provided in the circuit, they are preferably realized by a respective n-channel transistor. The source of the first transistor T1 lies at the potential b′ and the source of the second transistor T2 lies at the potential a′. The gate of the first transistor T1 is controlled by the output of a first clock-controlled voltage-doubler circuit BS1 and the gate of the second transistor T2 is controlled by the output of a second voltage doubler circuit BS2.

The input e of the individual voltage doubler circuit BS1 or BS2, etc., is realized by the source terminal of a first MOS field effect transistor t1 of the normally off type whose gate is controlled by a first clock signal $\phi_1$ and whose drain terminal lies at the input of an inverter i. The output of the inverter is connected to a node. A first path leads from this node to the one input of a first NOR gate n1. This path is realized by the source-drain segment of a second, normally off MOS field effect transistor t2 which is identical to the first transistor t1. The second terminal of the first NOR gate n1 lies directly at the node. The one input of a second NOR gate n2 having two inputs likewise lies directly at the node, whereas a second clock signal $\phi_2$—which simultaneously serves for the control of the gate of the second transistor t2—is adjacent at its other input. Finally, the node is also connected to the gate of a third MOS field effect transistor t3 of the normally off type whose source terminal lies at the output of the first NOR gate n1, whose drain terminal lies at the output a″ of the voltage doubler circuit, and whose source-drain segment is bridged by an MOS capacitor c.

The output of the second NOR gate n2 of the voltage doubler circuit controls a fourth normally off MOS field effect transistor t4 whose drain lies at the supply potential V$_{cc}$ of the circuit and whose source lies at the output a″ of the voltage doubler circuit.

The behavior of the voltage doubler circuits BS1, BS2, etc. employed in the circuit of FIG. 4 may be seen from FIG. 4b. All of these voltage doubler circuits are constructed in the manner indicated in FIG. 4a.

The two clock pulses $\phi_1$ and $\phi_2$ which control each of the voltage doubler circuits provided in the circuit are pulses that are inverse relative to one another. The duration of the individual pulses $\phi_1$ and $\phi_2$ is noticeably shorter than the duration of the signal applied to the input e. When a logic "1" appears at the input e of the voltage doubler circuit during the presence of the pulse $\phi_1$, then the output of n2 is immediately changed to logic "1", whereas the output of n1 remains at "0" because of the transfer transistor t2 inhibited with $\phi_2$="0". The transistor t4 therefore pre-charges the capacitor c. When, on the other hand, $\phi_2$ has the logic level "1", then the output of n1 also changes to logic "1", whereby the output voltage a is doubled via the capacitive coupling with c. When a logic "0" appears at the input e during the duration of a pulse $\phi_1$, then the outputs of n1 and n2 immediately proceed to the level "0", whereby the capacitor c is discharged via the transistor t3.

Given the interface connection of the voltage doubler circuit BS1 provided for the control of the first MOS field effect transistor T1, as shown in FIG. 4 the input of the voltage doubler circuit is charged by a further inverter i1, whereas its output a″ lies at the gate of T1. In the case of the voltage doubler circuit BS2, the input e is directly connected to the output of a NOR gate N which also serves for charging the input of the inverter I1, so that the two voltage doubler circuits BS1 and BS2 are controlled inversely relative to one another at their input e by means of the NOR gate N.

The NOR gate N has seven inputs. Two of these are charged by the output of respective AND gates U1 and U2, respectively, which—just like the remaining inputs of the NOR gate N—are in turn connected to signal inputs 1-9 charged by external signals whose respective signals are supplied by the converter controller WST. Details regarding the charging of the inputs 1 through 9 shall be provided following the description of the circuit according to FIG. 4.

The NOR gate N, the two AND gates U1 and U2 provided for charging the NOR gate N, the inverter I1, the two voltage doubler circuits BS1 and BS2, and the two transistors T1 and T2 form the individual comparison stage in the analog-to-digital converter ADW together with the respective corresponding capacitor KWv in the capacitor network PN. Since the bit significance is (n+1), and accordingly (n+2) comparison stages are provided, that part of the circuit according to FIG. 4 which has been described up to now is provided a total of (n+2) times. In contrast thereto, the remaining parts of the circuit according to FIG. 4 are only provided in single fashion.

The differential amplifier DV controlled by the output 0 of the capacitor network PN is realized by means of a capacitively coupled inverter chain given the embodiment of the invention shown in FIG. 4. The output 0 of PN lies in the differential amplifier DV at the source of a transistor T3, on the one hand, whose drain lies at the terminal b* for the external reference potential REF* and whose gate is controlled via a further signal input 10. On the other hand, the output of PN is connected to the one terminal of a capacitor C1 whose second terminal is connected with the input of an inverter i2 bridged by a further MOS field effect transistor T4 of the same type as the previously cited transistors. The output of this latter inverter i2 connects to one terminal of a further capacitor C2, whereas the gate of its bridging transistor T4 is controlled by a signal input 11.

This latter capacitor C2 represents the connection to a further inverter i3 which is likewise bridged by an MOS field effect transistor T5. A further input 12 is provided for the control of the gate of the transistor T5. The output of the second inverter i3 of the differential amplifier DV is connected via a further capacitor C3 to the input of a further inverter i4 which is likewise provided with a bridging transistor T6. The bridging transistor T6 of the inverter i4 forming the output of the differential amplifier DV is controlled at its gate by a further signal input 13 of the circuit. Both the output as well as the input of this latter inverter i4 communicate with each of the two circuit parts A1 and A2 which in turn supply the internal base potential GND and the internal reference potential REF. The output of the inverter i4 also serves for the control of the comparator flip-flop KP.

The input of the comparator KP is formed by the one current-carrying terminal of a further MOS field effect transistor T7 whose gate is controlled by a signal input 14 whereas its drain lies at the input of an inverter chain formed of two inverters i5 and i6 bridged by a further MOS field effect transistor T8. A further signal input 15 is provided for the transistor T8 for the purpose of controlling its gate. The output of the second inverter i6 of the inverter chain i5, i6 is at the gate of a further MOS field effect transistor T9 whose drain is connected to the supply potential $V_{cc}$ and whose source, on the one hand, forms the output of the comparator KP and, on the other hand, is directly connected to the reference potential $V_{ss}$ of the circuit via a further MOS field effect transistor T10 which is controlled by a circuit point between the two inverters i5 and i6. The circuit for the comparator KP functions as a D-flip-flop with following output driver, as shall be explained in greater detail. Its output is adjacent to the converter controller WST which is only indicated in FIG. 2 and which can be designed in a traditional manner.

The circuit part A1, which is responsible for generating the programmed, internal base potential GND, has its input lying directly at the output of the inverter i4 of the differential amplifier DV. This input of A1 is realized by a current-carrying terminal of an MOS field effect transistor T11 whose gate is controlled by a signal input 15 and whose second, current-carrying terminal is connected, on the one hand, via a capacitor C4 to the terminal for the external base potential GND* and, on the other hand, to the gate of two further transistors of the same type as the transistors previously cited, namely the normally off transistors T12 and T13. One of these two transistors, namely the transistor T12, has its source at the reference potential $V_{ss}$ and has its drain both at the source terminal of a normally on MOS transistor T*1 and at the gate of a further normally off MOS transistor T14 whose source terminal is at the reference potential $V_{ss}$.

The gate of the normally on transistor T*1 in the first circuit part A1 is connected to the drain terminal of the last-mentioned MOS field effect transistor T14 and to the source terminal of the afore-mentioned transistor T13 which has its gate lying directly at the input transistor T11. The drain terminal of this transistor T13 as well as the drain terminal of the normally on transistor T*1 is at the post for the supply potential $V_{cc}$ of the circuit. The output a of the first circuit part A1 given by a circuit point between the two transistors T13 and T14 in the first circuit part A1 is connected via a transistor T15 of the normally off type to the input of the last inverter i4 of the differential amplifier DV whose gate is controlled by the signal input 2. The output a of the first circuit part A1 serves for charging the sequential logic system SW2 in a manner yet to be described.

The second circuit part A2 serving for the generation of the internal reference potential REF has a structure similar to that of the circuit part A1 which has just been described. Like the transistor T11 corresponding to it in A1, its input realized by a normally off transistor T16 is at the output of the inverter i4 of the differential amplifier DV. The second current-carrying terminal of the transistor T16 is connected via the storage capacitor C5 to the external base potential GND* and also is at the gate of a transistor T17 corresponding to the transistor T12 in circuit part A1 as well as at the gate of a transistor T*2 which corresponds to the transistor T13 but which, in contrast to T13, is normally on. Accordingly, the transistor T17 has its source at the reference potential $V_{ss}$ and has its drain at the source of a transistor T18 which takes the place of the transistor T*1 in the circuit part A1 but which, in contrast to T*1, is of the normally off type. The drain of T18 is at the supply potential $V_{cc}$. Further, a circuit point between T17 and T18 is connected to the gate of an MOS field effect transistor T19 which corresponds to the transistor T14 in circuit part A1 and which has its source terminal applied to the post for the reference potential $V_{ss}$, said MOS field effect transistor T19 being connected to the supply potential $V_{cc}$ upon turn-on of the afore-mentioned transistor T*2 which is controlled by the input transistor T16. A circuit point between T*2 and T19 serves both as output b of the circuit part A2 as well as for the control of the gate of the transistor T18. The output b of the second circuit part A2 is applied via the source-drain segment of a normally off transistor T20 to the input of the inverter i4 in the differential amplifier DV. This transistor T20 is controlled at its gate by the signal supplied via the signal input 3, whereas a further input 16 is provided for the control of the gate of the input transistor T16 of A2.

The embodiment of the sequential logic system SW2 illustrated in FIG. 4 has the job of connecting through the potentials applied to its inputs a, b, a* and b* as well as $e_o ... e_m$ (=inputs AES in FIG. 1 and FIG. 2) to the output potential lines a', b'. For this purpose, b' is connected via the current-carrying segment of the transistor T23 to the output b of the second circuit part A2, is connected via the transistor T24 to the output a of the first circuit part A1, is connected via the transistor T25 to the external reference potential input b* and is also connected via a respective transistor T* of the normally-off type to one of the analog input potentials $e_o, ... e_m$. The potential line a' is connected via the current-carrying segment of the transistor T21 to the output a of the circuit part A1 and is connected via the transistor T22 to the external base potential input a*.

The gates of all of these transistors T21–T25 and T* are controlled by the output of a respective voltage doubler circuit according to FIG. 4a, namely T23 by BS3, T24 by BS4, T25 by BS5, T21 by BS6, T22 by BS7 and each transistor T* by a corresponding voltage doubler circuit BS*.

The inputs of these voltage doubler circuits e are charged by control signals that are supplied by the converter controller WST. The following allocation is thus provided. The input of BS3 is charged by means of an OR operation OD by the control signal at the control input 4 (SPRF - sample REF) and the control signal 17 (IREF - internal REF).

The input of BS4 is controlled by the control signal 5 (SPGND - sample ground). The input of BS5 is controlled by the control signal 18 (EREF - external REF). The input of BS6 is at the control signal 21 (IGND - internal ground). The input e of BS7 is at the control signal 22 (EGND - external ground). The inputs of the BS* respectively receive signals upon activation of an AND operation UN by the control signal 1 (PRAX - precharge analog input) with one of the control signals 19* ($CAN_i$-convert analog input i). The control signals 1, 4, and 5 simultaneously serve for the control of the sequential logic system SW1 and, as indicated above, charge some inputs of the NOR gate N.

In conclusion, the controlling of the seven inputs of this NOR gate N in SW1 shall also be discussed. As already mentioned above, a first input of N is at the signal input 5, a second input of N is at the signal 4, and a third input of N is at the signal 1, so that these signal inputs are provided at the same time for controlling with SW2. The further signal input 6 of the circuit serves for controlling a fourth input of N. The same is true of the signal input 7. The two remaining inputs of the NOR gate N are controlled by a respective AND gate U1 or U2 so that the two inputs of the AND gate U1 are at the second signal input 2 or at the eighth signal input 8 of the circuit. The one input of U2 is at the signal input 3 and the other input of U2 is at the signal input 9 of the circuit. Again to be pointed out in this context is that the signal input 2 is also provided for the control of transistor T15 in the first circuit part A1 and the signal input 3 is also provided for the control of the transistor T20 in the second circuit part A2.

Before turning to a description of the operating mode of the embodiment of the invention shown in FIGS. 3 and 4, a table for the charging of the signal inputs in FIGS. 3 and 4 shall be listed:

the signal input 1 is controlled with the signal PRAX (precharge analog input);

the signal input 2 is controlled with the signal PRGD (precharge ground);

the signal input 3 is controlled by the signal PREF (precharge REF);

the signal input 4 is controlled by the signal SPRF (sample REF); and

SPGD (sample ground) is at signal input 5.

The control signals 1–5 simultaneously charge all (n+2) NOR gates N in the (n+2) stages of the sequential logic system SW1. As already pointed out above, the control signals 1, 4, and 5 simultaneously control the sequential logic system SW2 and the control signals 2 and 3 simultaneously control the circuit parts A1 and A2.

In contrast thereto, the control signals 6–9 are provided once for each of the (n+2) stages. They respectively represent the corresponding bit $\nu$ of a digital word offered by the converter controller, said digital word being (n+1) bits wide. In detail, the control signal 6 is controlled by the signal BIT which indicates the respectively handled bit in the A/D conversion according to the method of successive approximation. Control signal 7 is realized by the signal $RSDT\nu$ (bit $\nu$ of the result data register), whereas the signal input 8 is controlled by the signal $GDDT\nu$ (bit $\nu$ of the ground data register) and the signal input 9 is controlled by the signal $RFDT\nu$ (bit $\nu$ of the reference data register).

The inputs 6–9 of the NOR gate N of the last stage S in the sequential logic system SW1 (FIG. 3) are all controlled with logic "0".

The input 10 in the differential amplifier DV is controlled with PRDA1 (precharge differential amplifier 1), the input 11 in the differential amplifier DV is controlled with PRDA2 (precharge differential amplifier 2), the input 12 in the differential amplifier DV is controlled with PRDA3 (precharge differential amplifier 3) and the input 13 is controlled with PRDA4 (precharge differential amplifier 4).

The input 14 in the comparator KP is controlled by LDKP (load comparator) and the input 14a is controlled by $\overline{LDKP}$ (load comparator inverted). The output of the comparator KP is referenced A* and pends at the converter controller WST which is not shown in FIG. 4.

The input 15 in the circuit part A1 is controlled by the signal $\overline{HDGD}$ (hold ground, inverted) and the input 16 in the circuit part A2 is controlled by the signal $\overline{HDRF}$ (hold reference, inverted).

The input 17 in the sequential logic system SW2 is controlled by the signal IRF (internal reference), the input 18 is controlled by the signal ERF (external reference), the input 21 is controlled by the signal IGD (internal ground) and the input 22 is controlled by the signal EGD (external ground). Each of the provided inputs 19* is controlled by the signal $CAN\mu$(convert analog input $\mu$) which is specifically directed to the analog input $e\mu$allocated to this input.

The following can then be pointed out in conjunction with the circuit according to FIGS. 3 and 4.

The complete analog-to-digital conversion in the converter ADW occurs in three steps:

(1) In the first step, a digital-to-analog conversion occurs of a binary word written into the corresponding register of the converter controller WST by the microprocessor MP (for example, the binary words $RFDT_7$, $RFDT_6, ... RFDT_1, RFDT_0$ present at the signal inputs 8 given a resolution of 8 bits in the converter ADW) into the analog potential REF by use of the external reference potential REF* and of the external base potential GND*. The potential REF is stored in analog fashion in the circuit part A2.

(2) In the second step, digital-to-analog conversion occurs of a binary word supplied to the corresponding register of the converter controller WST by the microprocessor MP (GDDT$_7$, GDDT$_6$, . . . GDDT$_1$, GDDT$_0$ is applied to the signal inputs 9) into the analog potential GND by use of the external potentials GND* and REF*. The potential GND is stored in analog fashion in the circuit part A1.

(3) In the third step, the analog-to-digital conversion of one of the analog potentials ANA$_0$, ANA$_1$ . . . ANA$_m$ applied to the analog signal inputs e$_1$, . . . e$_m$ occurs on the basis of a selection undertaken by the microprocessor MP by use of the potentials GND and REF generated according to step 1 and step 2.

In detail, the three steps sequence as follows:

(1): In a precharge phase (precharge), the zero drifts (offsets) are first compensated in the inverter amplifier stages i2, i3, i4 and the prescribed binary word (RFDT$_7$, RFDT$_6$, . . . RFDT$_1$, RFDT$_0$) is loaded onto the capacitor network PN. For this purpose, the inputs of the inverter stages i2, i3 and i4 of the differential amplifier DV are set to their operating point potentials by means of the control signals having the logic level "1" which are forwarded to the inputs 11 and 12. The last inverter stage i4 is fed-back by means of the signals $\overline{\text{HDRF}}$="1" (control signal 16) and $\overline{\text{PRRF}}$="1" (control signal 3) ($\overline{\text{HDRF}}$=$\overline{\text{HOLD REF}}$; $\overline{\text{PRRF}}$=$\overline{\text{precharge REF}}$) via the analog memories and driver provided in the circuit part A2 for the internal reference voltage REF. The common side of the capacitor network PN, meanwhile, is connected by the signal PRDA1 (control signal 10) ="1" to the terminal b* for the external reference potential REF*. Via the sequential logic system SW2, the inputs a', b' are charged with the external reference potential REF* and the base potential GND* by means of the signals ERF ="1" and EGD ="1" supplied to the signal inputs 17 and 22, respectively.

With the assistance of the signal PRRF (control signal 3)="1", all non-common sides of those capacitors KW$\nu$ in the network PN are connected to the potential line b' that lies at REF* via SW2, for which the corresponding bit value RFDT$\nu$ of the binary value (RFDT$_7$, RFDT$_6$, . . . RFDT$_1$, RFDT$_0$) is at "1", whereas the remaining capacitors in the capacitor network PN are connected by the corresponding changeover switch to the potential line a' which lies at GND* via SW2. The capacitor network thus receives the charge $$K \cdot (\text{REF}^* - \text{GND}^*) + \sum_{\nu=0}^{7} 2^\nu \cdot K \cdot (\text{REF}^* - \text{GND}^*) \cdot (1 - \text{RFDT}_\nu).$$

The coupling capacitor C1 to the differential amplifier DV stores the potential difference between the external reference potential REF* and the operating point of the first inverter stage i2, whereas the coupling capacitors C2, C3 between the inverter stages i2, i3, i4 contain the difference of the operating points of the stages connected by them.

In the following setting phase, the disconnection of the precharge signals PRRF (control signal 3) ="0" and ERF (control signal 18) ="0" as well as the connection of the signal SPRF (control signal 4) ="1" (=sample REF) given retention of $\overline{\text{HDRF}}$ (control signal 16) at the level "1" causes the connection of the non-common side of all capacitors KW of the capacitor network PN to the potential line b' which is in turn connected via the sequential logic system SW2 to the output b of the circuit part A2. The differential amplifier DV is thus completely fed back in a negative manner via A2, SW2, SW1 and the capacitor network PN, and assumes a setting such that the input of the first, amplifying inverter stage i2 in DV again lies at the previously set operating point. The potential of the common side of the capacitors KW in the capacitor network which form the output 0 of PN is thus again at the value REF* and the charge stored in these capacitors KW is now uniformly distributed, so that $$K \cdot 2^8 (\text{REF}^* - \text{REF}) = K \cdot (\text{REF}^* - \text{GND}^*) +$$

$$\sum_{\nu=0}^{7} K \cdot 2 \cdot (\text{REF}^* - \text{GND}^*) \cdot (1 - \text{RFDT}_\nu) \text{ or}$$

$$\text{REF}^* - \text{REF} = 1/2^8 \cdot$$

$$\left( (\text{REF}^* - \text{GND}^*) \cdot \left( 1 + \sum_{\nu=0}^{7} 2^\nu \cdot (1 - \text{RFDT}_\nu) \right) \right) \text{ and, thus,}$$

$$\text{REF} - \text{GND}^* = (\text{REF}^* - \text{GND}^*) \left( \sum_{\nu=0}^{7} (2^{\nu-8} \text{RFDT}_\nu) \right)$$

applies. (The values relate to the case of a data capacity of 8 bits.)

As a result of the signal $\overline{\text{HDRF}}$ (control signal 16) ="0", the input potential of the driver stage T*$_2$, T17, T18 and T19 in the circuit part A2 required for reaching this potential REF at the output of A2 is now locked onto the storage capacitor C5 thereof, so that this potential REF is available for later use in step 3).

In Step (2): The analog base potential GND supplied by the circuit part A1 is readied in the same manner. In the precharge phase, the binary value (GDDT$_n$, . . . GDDT$_0$ (=ground data)) is forwarded to the non-common side of the capacitor network PN by means of the signal PRGD (control signal 2) ="1" (=precharge ground), whereas the analog storage driver stage A1 is balanced together with the last inverter stage i4 of the differential amplifier DV for the purpose of generating the internal base potential GND. In the setting phase, the output a of the circuit part A2 is connected to the potential line b' by the signal SPGD (control signal 5) ="1", so that -- after disconnection of the signal $\overline{\text{HDGD}}$ (control line 15) ="0" (=hold ground, inverted)—a potential is locked onto the storage capacitor C4 in the circuit part A1. This potential defines the internal base potential GND at the output of the driver stage in A1. This results according to the equation $$\text{GND} - \text{GND}^* = (\text{REF}^* - \text{GND}^*) \left( \sum_{\nu=0}^{7} (2^{\nu-8} \text{GDDT}_\nu) \right).$$

In step (3): The analog-to-digital conversion which now follows proceeds in accordance with the explanations in the reference "Siemens Forschungs- und Entwicklungsberichte", Vol. 8 (1979) No. 5, page 262, incorporated herein by reference. The only difference to be noted is the fact that the external base potential GND* as well as the external reference potential REF* are employed there for the conversion, whereas the internal potentials REF and GND generated in the circuit parts A1 and A2 are used for the conversion in the present instance. These potentials are forwarded to the inputs b' or a' of the sequential logic system SW1 by the signals IRF (control signal 17) and IGD (control signal 21) supplied by the converter controller.

The difference, however, leads to the fact that the invention utilizes an analog-to-digital converter ADW having a moderate expense for comparison stages, particularly a converter comprising 8 stages, and which can nonetheless operate with a considerable number of voltage ranges for the analog signals to be processed. A converter having a larger number of stages (for example 10–12) would be required for this purpose in a conventional manner.

I claim as my invention:

1. An analog signal scaling system for inputting a plurality of analog signals into a microprocessor via an analog-to-digital converter means wherein the analog-to-digital converter means has a plurality of analog inputs, each of which is associated with an external analog input signal to be digitalized, and a control input line being provided between the microprocessor and the analog-to-digital converter for control by the microprocessor and an output line is provided from the analog-to-digital converter to the microprocessor for transferring digital output signals obtained corresponding to each of the analog input signals to the microprocessor, comprising:

a digital-to-analog converter means wherein an output line is provided from the microprocessor to the digital-to-analog converter means the digital-to-analog converter means selecting appropriate scaling by output to the analog-to-digital converter means of an internal base potential and an internal reference potential so as to define a reference voltage therebetween corresponding to a particular analog signal being input and processed by the analog-to-digital converter means and thus scale the same, the digital-to-analog converter means also having an external base potential input and an external reference potential input so as to define an external reference voltage therebetween;

said analog-to-digital converter means further including a scaling network designed as a capacitance network with digitally weighted capacitors;

said digital-to-analog converter means comprising first and second circuit means each having a digital-to-analog function and wherein the first circuit means sets the internal base potential and the second circuit means sets the internal reference potential; and first and second sequential logic system means connecting to the analog-to-digital converter means and the digital-to-analog converter means for assisting the analog-to-digital conversion and the digital-to-analog conversion respectively.

2. A scaling system according to claim 1 wherein the capacitors of said capacitance network in said scaling network are all connected to one another at one side, and at the other side each of said capacitors is individually and selectively connected via the first sequential logic system means to either the internal base potential or the internal reference potential outputs from the digital-to-analog converter means.

3. A scaling system according to claim 1 wherein said first and second digital-to-analog circuit means each have an analog storage means and a driver means.

4. A scaling system according to claim 3 wherein said driver means in said first circuit means which generates said internal base potential and comprises three normally off MOS field effect transistors and a normally on transistor.

5. A scaling system according to claim 3 wherein said drive means in said second circuit means which generates said internal reference potential comprises three normally off MOS field effect transistors and a normally on MOS field effect transistor.

6. A scaling system according to claim 1 wherein said scaling network connects to a differential amplifier at a first input thereof and is connected at a second input with said external reference potential.

7. A scaling system according to claim 6 wherein said differential amplifier comprises a capacitor-coupled chain of inverter stages wherein, in a precharge phase, means are provided for setting operating points of the individual inverter stages by connecting an input to an output of each individual stage, differences of the individual operating points being stored at capacitors which respectively connect the individual stages; an input of said first inverter stage being coupled via a capacitor to an output of said precision or scaling network means; and said output of the scaling network being precharged to an external reference potential via a transistor circuit means during said precharging phase so that a difference between said external reference potential and the operating point of said first inverter stage is stored on the capacitor at the input of the first inverter stage.

8. A scaling system according to claim 7 wherein the setting of the operating point of the last inverter stage optionally occurs by directly connecting its input and output, by connecting its output to its input by a path formed in said first circuit means for generating the internal base potential; or by connecting its output to its input via a path in said second circuit means for generating the internal reference potential defining the internal reference voltage to be generated.

9. A scaling system according to claim 1 wherein said first and second sequential logic system means comprise normally off transistor switches whose control electrodes are driven via a respective voltage doubler circuit.

10. A scaling system according to claim 9 wherein:

an input of the individual voltage doubler circuits is connected to a node via a first transfer transistor controlled by a first clock signal and a following inverter;

from said node a source-drain path of a second transfer transistor controlled by a second clock signal connects to one terminal of a first NOR gate;

from said node a direct connection to one input of a second NOR gate whose other input is controlled by said second clock signal;

from said node a direct connection leads to a second input of said first NOR gate;

from said node a gate of a third MOS field effect transistor is controlled whose source-drain path is bridged by a capacitor;

said third transistor forming a connection between an output of said first NOR gate and an output of said voltage doubler circuit; and an output of said second NOR gate controlling a further normally off MOS field effect transistor which connects said output of said voltage doubler circuit to a supply terminal which carries a supply potential.

* * * * *